(12) United States Patent
Ounaies et al.

(10) Patent No.: US 7,935,414 B2
(45) Date of Patent: *May 3, 2011

(54) MULTILAYER ELECTROACTIVE POLYMER COMPOSITE MATERIAL

(75) Inventors: Zoubeida Ounaies, College Station, TX (US); Cheol Park, Yorktown, VA (US); Joycelyn S. Harrison, Hampton, VA (US); Nancy M. Holloway, White Marsh, VA (US); Gregory K. Draughon, Hampton, VA (US)

(73) Assignee: United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/406,315

(22) Filed: Mar. 18, 2009

(65) Prior Publication Data

US 2010/0068485 A1    Mar. 18, 2010

Related U.S. Application Data

(63) Continuation of application No. 11/081,888, filed on Mar. 9, 2005, now Pat. No. 7,507,472.

(60) Provisional application No. 60/551,055, filed on Mar. 9, 2004.

(51) Int. Cl.
*B32B 5/16* (2006.01)
(52) U.S. Cl. ........ 428/212; 428/141; 428/143; 428/325; 977/783; 977/832
(58) Field of Classification Search .................. 428/141, 428/143, 212, 325; 977/783, 832
See application file for complete search history.

(56) References Cited

U.S. PATENT DOCUMENTS

| | | | |
|---|---|---|---|
| 6,265,466 B1 | 7/2001 | Glatkowski et al. | |
| 6,515,077 B1 | 2/2003 | Su et al. | |
| 6,689,288 B2 | 2/2004 | St. Clair et al. | |
| 6,762,237 B2 * | 7/2004 | Glatkowski et al. | 524/496 |
| 6,809,462 B2 * | 10/2004 | Pelrine et al. | 310/319 |
| 6,936,653 B2 * | 8/2005 | McElrath et al. | 524/496 |
| 6,946,851 B2 * | 9/2005 | Lee et al. | 324/658 |
| 7,064,472 B2 * | 6/2006 | Pelrine et al. | 310/324 |
| 7,320,457 B2 * | 1/2008 | Heim et al. | 251/129.06 |
| 7,402,264 B2 * | 7/2008 | Ounaies et al. | 252/511 |
| 7,573,064 B2 * | 8/2009 | Benslimane et al. | 257/48 |

OTHER PUBLICATIONS

Dai et al, Plasma Polymerization and Microfabrication of Electroactive Polymers and Carbon Nanotubes, Smart Materials, SPIE vol. 4234 (2001).*

* cited by examiner

*Primary Examiner* — H. (Holly) T Le
(74) *Attorney, Agent, or Firm* — Thomas K. McBride, Jr.; Linda B. Blackburn

(57) ABSTRACT

An electroactive material comprises multiple layers of electroactive composite with each layer having unique dielectric, electrical and mechanical properties that define an electromechanical operation thereof when affected by an external stimulus. For example, each layer can be (i) a 2-phase composite made from a polymer with polarizable moieties and an effective amount of carbon nanotubes incorporated in the polymer for a predetermined electomechanical operation, or (ii) a 3-phase composite having the elements of the 2-phase composite and further including a third component of microsized to nano-sized particles of an electroactive ceramic incorporated in the polymer matrix.

11 Claims, 3 Drawing Sheets

MULTILAYER ELECTROACTIVE POLYMER COMPOSITE MATERIAL

CROSS-REFERENCE TO RELATED PATENT APPLICATIONS

This patent application is a continuation of Ser. No. 11/081,888, entitled "Multilayer Electroactive Polymer Composite Material," filed Mar. 9, 2005, issued as U.S. Pat. No. 7,507,472. This application is also with related patent applications of Ser. No. 11/076,460, issued as U.S. Pat. No. 7,402,264 and of Ser. No. 12/109,490, issued as U.S. Pat. No. 7,527,751; by the same inventors as this patent application. This patent application claims the benefit of U.S. Provisional Patent Application No. 60/551,055 filed Mar. 9, 2004.

ORIGIN OF THE INVENTION

The invention was made in part by employees of the United States Government and may be manufactured and used by and for the Government of the United States for governmental purposes without the payment of any royalties thereon or therefore.

FIELD OF THE INVENTION

This invention relates to electroactive materials. More specifically, the invention relates to a multilayer electroactive composite material made from layers of electroactive materials wherein each layer is tailored in terms of its dielectric, electric and mechanical properties.

SUMMARY OF THE INVENTION

An electroactive material comprises multiple layers of electroactive material with each layer having unique dielectric, electrical and mechanical properties that define an electromechanical operation thereof when affected by an external stimulus.

DETAILED DESCRIPTION OF THE EMBODIMENTS

The present exemplary embodiments provide a new class of electroactive polymer composite materials made from layers of electroactive materials. Each layer is tailored in terms of its dielectric, electric and mechanical properties that ultimately define the layer's electromechanical operation. By making each layer unique, the ultimate electroactive material is functionally gradient in its electromechanical operation. For example, each layer could be designed to have its electromechanical operation triggered only in response to a certain level (or range of levels) of external stimulus. Another option is for each layer to have a specific performance capability (e.g., an amount of displacement or voltage generated in response to an external stimulus) triggered by any level of external stimulus. Still another option is a combination of the previous two examples whereby each layer is designed for a specific performance that is triggered only when a specific level (or range of levels) of external stimulus affect the device. Accordingly, the term "functionally gradient electromechanical operation," as used herein, can refer to the material's electroactive sensitivity and/or the material's electroactive performance.

Figure 1:
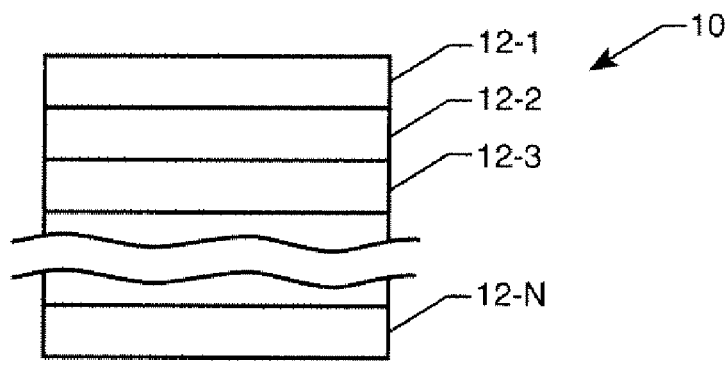
FIG. 1 is a side view of a multilayer electroactive composite material according to an embodiment of the present invention.
Figure 2:
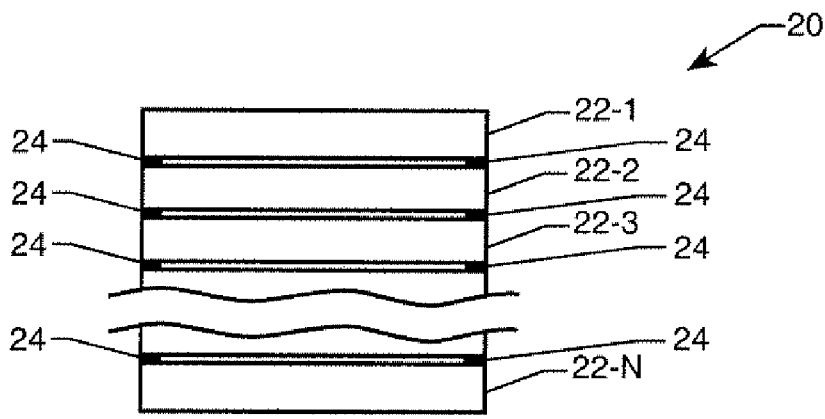
FIG. 2 is a side view of a multilayer electroactive composite material according to another embodiment of the present invention.
Figure 3:
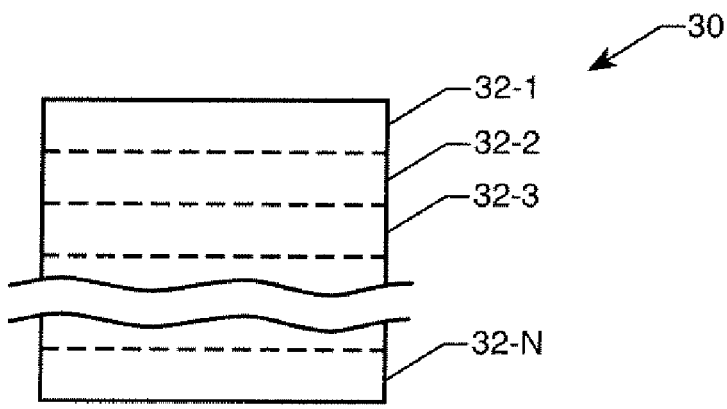
FIG. 3 is a side view of a multilayer electroactive composite material according to still another embodiment of the present invention.

Referring now to the drawings, FIGS. 1-3 are general depictions of three different exemplary embodiments for multilayer electroactive composite materials in accordance with the present invention. In each embodiment, each of the layers is designed to provide a predetermined gradient level of electromechanical operation. The gradient levels can be discrete or can be overlapping without departing from the scope of the present invention.

FIG. 1 illustrates a multilayer electroactive composite material 10 made from individual layers 12-1, 12-2, 12-3, . . . , 12-N of electroactive material. All layers of material 10 are coupled or bonded together across their tangent faces. FIG. 2 illustrates a multilayer electroactive composite material 20 made from individual layers 22-1, 22-2, 22-3, . . . , 22-N of electroactive material where adjacent layers are only partially bonded to one another as indicated at regions 24. In this drawing, the spaces shown between the unbonded portions of adjacent layers can be indicative of either an actual gap or unbonded contact. Each of materials 10 and 20 would typically be fabricated by first making each individual layer and then coupling/bonding the individual layers to one another as just described. However, another option is shown in FIG. 3 where a multilayer electroactive composite material 30 is made from layers 32-1, 32-2, 32-3, . . . , 32-N of electroactive material that are seamlessly bonded to one another (as indicated by the dashed lines therebetween) during, for example, a sequential spray on, spin cast or solution cast fabrication. Before each sequential fabrication step, the raw material for the layer would be altered as necessary to provide for the specific electromechanical operation thereof. Seamless bonding of layers would occur in accordance with the curing process associated with the particular electroactive materials.

The layers in each of the above-described materials could be made from a variety of electroactive materials. For example, each layer could comprise one of the new electroactive materials described in the cross-referenced patent application entitled "SENSING/ACTUATING MATERIALS MADE FROM CARBON NANOTUBE POLYMER COMPOSITES AND METHODS FOR MAKING SAME," U.S. patent application Ser. No. 11/076,460 filed Mar. 3, 2005, the contents of which are hereby incorporated in their entirety by reference. The new materials are carbon nanotube polymer composites that provide improved electromechanical operation when affected by some external stimulus. For example, the electromechanical operation can be a sensing operation that involves the generation of an electrical signal in response to deformation of the electroactive material caused by a change in its physical environment (e.g., changes in noise, vibration, stress, pressure, flow, temperature, etc.). The electromechanical operation could also be an actuating operation that involves mechanical movement of the electroactive material when the material has a stimulating electric potential applied thereto.

More specifically, each layer in a multilayer material of the exemplary embodiments can be an electroactive sensing/actuating ("sensuating") material that comprises a 2-component or "2-phase" composite material. The base material is a polymer matrix wherein the polymer comprises an electroactive type having polarizable moieties. The remaining component or phase comprises nanotubes incorporated in the polymer matrix. Electroactive polymers with polarizable moieties include those with asymmetrically strong dipoles. Suitable polymer classes fitting this description include, but are not limited to, polyimides, polyamides, silicon-based polymers, vinyl polymers, polyurethanes, polyureas, polythioureas, polyacrylates, polyesters, and biopolymers. The polyimides include but are not limited to 2,6-bis(3-aminophenoxy)benzonitrile (($\beta$-CN)APB)/4,4'oxydiphthalic anhydride (ODPA) (($\beta$-CN)APB-ODPA) and other polyimides with polarizable moieties, and polyetherimide (e.g., the commercially-available ULTEM®). The polyamides include but are not limited to odd-numbered nylons. The silicon-based polymers include but are not limited to silicone and polydimethylsiloxane (PDMS). The vinyl polymers include but are not limited to PVDF, PVDF/TrFE (copolymer of vinylidene fluoride and trifluoroethylene), polyvinyl alcohol) (PVA), a graft elastomer such as that claimed in U.S. Pat. No. 6,515,077, the entire contents of which are incorporated herein by reference, and vinyl copolymers. The polyacrylates include but are not limited to polymethyl methacrylate (PMMA). The biopolmers include but are not limited to polypeptides and keratin.

The presence of strong dipoles (associated with the above-mentioned polymers with polarizable moieties) have led researchers and industry to attempt to construct piezoelectric sensors and actuators from these materials and blends of such polymers as disclosed, for example, in U.S. Pat. No. 6,689,288, the entire contents of which are incorporated herein by reference.

The 2-phase electroactive materials described herein use nanotube inclusions to improve the electomechanical response of the polymer having polarizable moieties. In general, such nanotubes can be based on a variety of elements, including carbon or other metallic and semi-metallic elements. However, carbon nanotubes will be described specifically in the example. Such carbon nanotubes can be single-wall nanotubes (referred to as "SWNT"), or they can be nanotubes made from multiple walls, e.g., double-wall, few-wall, multi-wall, etc., all of which are referred to herein as "MWNT".

Accordingly, the 2-phase electroactive sensing/actuating (or sensuating) composite comprises a selected polymer matrix having nanotube inclusions. In order to produce an electroactive material that acts as either a sensor or actuator, it has been discovered that only small amounts of carbon nanotubes need to be incorporated into the polymer matrix. The small amounts of nanotubes used in the 2-phase composite materials are defined herein as a volume fraction of the ultimate composite. For example, the volume fraction of nanotubes in the exemplary 2-phase composite is expressed as "X percent of the volume of the composite". The value of "X" is arrived after consideration of the type of operation (e.g., sensing, actuating) and the amount of electromechanical motion of interest for a given polymer matrix and given external stimulus. No specific volume fraction of nanotubes (for a particular polymer) will define a clear transition between sensing and actuating operations. Rather, a general range of volume fraction of nanotubes will enable the composite to behave better as either a sensor or actuator. Thus, the sensing or actuating functions of the material for the present embodiment can be varied and controlled by the volume fraction of nanotube inclusions.

The above-described 2-phase sensing/actuating (sensuating) polymer composite comprises pure polymers with polarizable moieties having nanotube inclusions. However, the layers in the multilayer composite material of the exemplary embodiments could also be made from, for example, a 3-phase polymer composite wherein the three components comprise:

(i) a polymer matrix wherein the polymer is an electroactive type having polarizable moieties,
(ii) micro to nano-sized particles of an electroactive ceramic incorporated in the polymer matrix, and
(iii) carbon nanotubes incorporated in the polymer matrix.

Prior efforts to improve the electromechanical operation of pure piezoelectric polymers have focused on incorporating various piezoelectric ceramics (e.g., lead-zirconium-titanate or "PZT") into the polymers to form a composite. However, the large dielectric mismatch between these two significantly different types of materials (i.e., ceramic-to-polymer dielectric ratios on the order of 50:1 or greater) makes it difficult to pole both phases of the composite. That is, the electric field required to pole both phases is generally much larger than the electric field required to pole the pure ceramic phase because of a large dielectric mismatch.

The 3-phase sensing/actuating (sensuating) composites reduce dielectric mismatch through the use of small amounts of nanotube inclusions. As in the 2-phase case, nanotubes utilized in the 3-phase composites can be based on a variety of elements to include carbon and other metallic or semi-metallic elements. Carbon nanotubes will be described specifically in the example. The carbon nanotubes used in the 3-phase composite can be SWNT or MWNT.

The electroactive ceramics utilized in the 3-phase composite of the present embodiment can be any piezoelectric ceramic that can be reduced to micro-sized or nano-sized particles while providing the appropriate electromechanical response, thermal stability and chemical stability for a predetermined application. Such ceramics include but are not limited to lead-zirconium-titanate (PZT), lanthanum-modified lead zirconate titanate (PLZT), niobium-modified lead zirconate titanate (PNZT), and barium titanate. By way of illustrative example, the electroactive ceramic PZT will be specifically discussed.

An embodiment of the 3-phase composite comprises a selected polymer matrix with both ceramic and nanotube inclusions. To produce a 3-phase composite that acts as either a sensor or actuator, only small amounts of nanotubes need to be incorporated in the composite. Similar to the 2-phase composite, the amount of nanotube inclusions is expressed as a volume fraction of nanotubes to the total volume of the ultimate 3-phase composite.

Methods for making the 3-phase composite include steps for the nanotubes to be either: (i) incorporated in the polymer matrix before incorporation of the ceramic particles, or (ii) first mixed with the ceramic particles in a solution that is then incorporated in the polymer matrix.

The three-component nature of the 3-phase composite provides for the tailoring and adjusting of composition and morphology to optimize mechanical, electrical, and electromechanical properties for sensing and actuating operations. The effects of the dielectric mismatch between the polymer and ceramic are greatly reduced by nanotube inclusions that serve to raise the dielectric constant of the polymer matrix in the 3-phase composite even when small amounts of nanotubes are used. Thus, the amount of nanotubes used is a predetermined volume fraction that balances the amount required to minimize the dielectric mismatch between the polymer and ceramic against the amount requisite for providing a predetermined electromechanical operation during a given application.

Multilayer electroactive composite materials of the present invention can be made from layers of the above-described (i) 2-phase composites, (ii) 3-phase composites, or (iii) 2-phase and 3-phase composites. The base polymer in each layer can be the same or different. In terms of the 3-phase composites, the ceramic used in each layer can be the same or different. Under this approach, each layer of the multilayer material can be specifically tailored in terms of its dielectric, electric and mechanical properties that define the electromechanical operation of the layer.

EXAMPLES

Examples of 2-phase and 3-phase composite materials suitable for use in multilayer composite materials of the exemplary embodiments will now be described. The selected polymer in both the 2-phase and 3-phase materials was an aromatic piezoelectric polyimide, β-CN APB/ODPA polymer matrix. The nanotubes used were single-wall carbon nanotubes or "SWNT" as they will be referred to hereinafter. The diameter and length of the SWNTs were approximately 1.4 nm and 3 μm, respectively. The 2-phase SWNT-polyimide composites were prepared by in situ polymerization under sonication and stirring. The density of pure polyimide was about 1.3 g/cm$^3$, and the calculated density of the SWNTs have been reported ranging from 1.33-1.40 depending on chirality. The diamine and dianhydride used to synthesize the nitrile polyimide were 2,6-bis(3-aminophenoxy) benzonitrile ((β-CN)APB) and 4,4' oxidiphthalic anhydride (ODPA), respectively. To prepare the SWNT-polyimide 2-phase composite, the SWNTs were dispersed in anhydrous dimethyl formamide (DMF) that served as a solvent for the poly(amic acid) synthesis. The entire reaction was carried out with stirring in a nitrogen-purged flask immersed in a 40 kHz ultrasonic bath until the solution viscosity increased and stabilized. Sonication was terminated after three hours and stirring was continued for several hours to form a SWNT-poly(amic acid) solution. The SWNT-poly(amic acid) solution was cast onto a glass plate and dried in a dry air-flowing chamber. Subsequently, the dried tack-free film was thermally cured in a nitrogen oven to obtain solvent-free freestanding SWNT-polyimide film.

A series of SWNT-polyimide nanocomposite films were prepared with SWNT concentrations ranging from just greater than 0.00 percent (e.g., 0.01 percent) to approximately 2.0 percent volume fractions. A similar procedure was followed to make the 3-phase SWNT-PZT-polyimide composites (having similar SWNT concentrations) where, in addition to dispersing the SWNT in DMF before the poly(amic acid) synthesis, nano-sized PZT particles/powders were also dispersed in DMF separately and then mixed with SWNT-DMF and the polyimide precursor.

Figure 4:
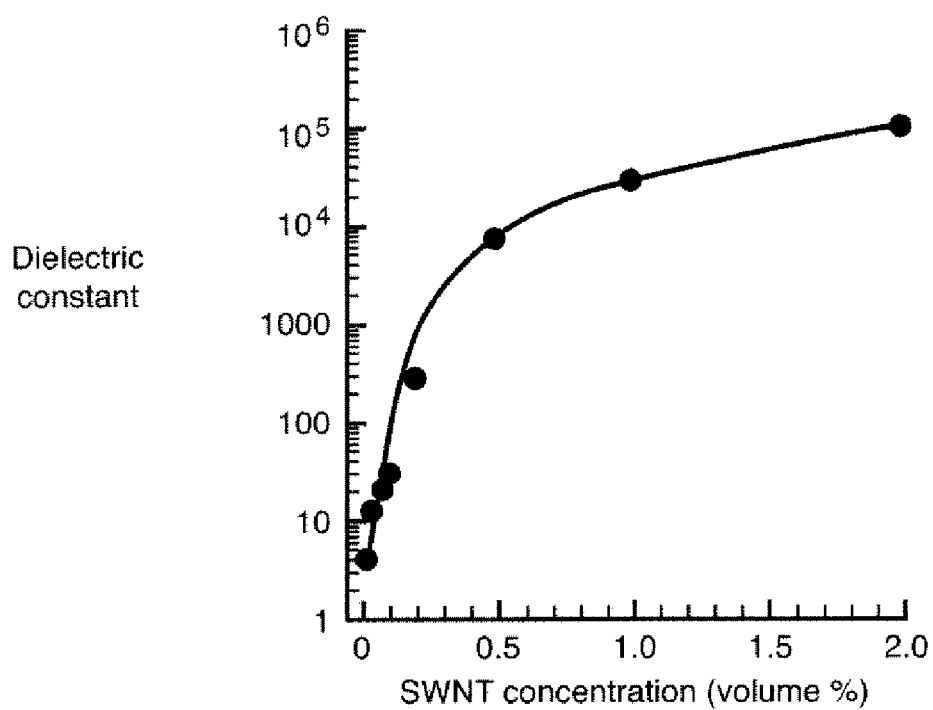
FIG. 4 is a graph of dielectric constant as a function of carbon nanotube content for an embodiment of a 2-phase carbon nanotube/polyimide composite that can be used as an embodiment of the present invention.

FIG. 4 shows the dielectric constant as a function of SWNT content for a 2-phase SWNT-polyimide composite. Sensing and actuating characteristics are strongly related to the dielectric properties and a higher dielectric constant material tends to provide greater electromechanical responses. The dielectric constant of the pristine polyimide was about 4.0. A sharp increase of the dielectric constant value was observed when a volume fraction of SWNTs between 0.02 and 0.1 percent was added to thereby change the dielectric constant from 4.1 to 31. This behavior is indicative of a percolation transition. Percolation theory predicts that there is a critical concentration or percolation threshold at which a conductive path is formed in the composite causing the material to convert from a capacitor to a conductor. FIG. 4 indicates that the percolation threshold for this material resides between 0.02 and 0.1 percent volume fraction of SWNTs. The dielectric constant increases rapidly up to a 0.5 percent SWNT volume fraction and thereafter increases moderately with increasing SWNT volume fraction.

Figure 5:
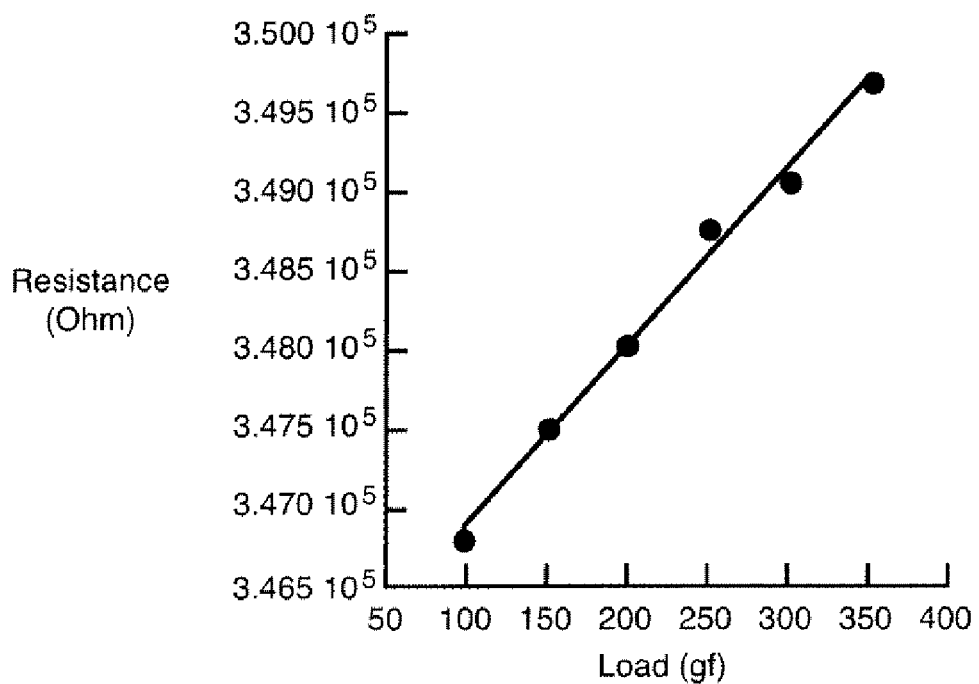
FIG. 5 is a graph of resistance as a function of load for a 2-phase carbon nanotube/polyimide composite that can be used as an embodiment of the present invention.

In FIG. 5, the resistance of a 0.2 percent SWNT-polyimide composite film is shown as a function of load in grams force (gf). Resistance was monitored using a 4-probe technique while the film was elongated in tensile mode under a constant rate of load. The resistance increased nearly linearly with the applied load at a rate of 114 ohm/g. This linear response indicates that this SWNT-polyimide composite can be used as a sensitive strain, load or pressure sensor. The sensitivity can be tailored by controlling the SWNT concentration for a specific application.

Figure 6:
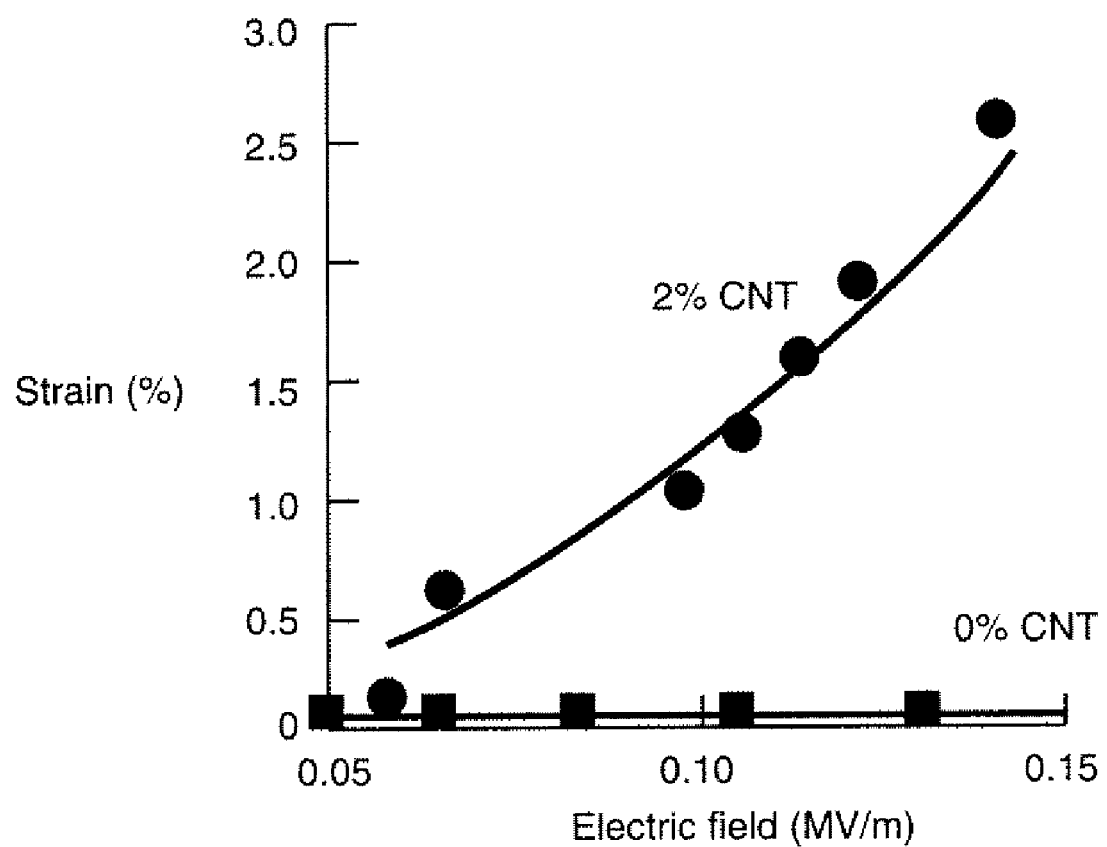
FIG. 6 is a graph of strain as a function of applied electric field for a 2-phase carbon nanotube/polyimide composite that can be used as an embodiment of the present invention.

FIG. 6 shows the strain of a 2.0 percent SWNT-polyimide composite as a function of the applied electric field. The strain increased with the square of the applied electric field thereby indicating that the strain was primarily due to electrostriction with negligible Maxwell effect rather than a piezoelectric response. The strain reached nearly 3% at 0.15 MV/m. This result is almost an order of magnitude greater strain simultaneous with an order of magnitude lower applied field when compared to commercial products such as PVDF and PZT, as noted in Table 1. A strip of this material demonstrated significant displacement when an electric field was applied. Further, the material then returned to the initial position when the field was removed. This type of electroactive response indicates that this composite can be used as an actuator.

TABLE 1

Strain for Electric Field

| Material | Strain | Electric Field |
| --- | --- | --- |
| PVDF | 0.1% | ~50 MV/m |
| PZT | 0.1% | ~1 MV/m |
| 2% SWNT-polyimide | 3% | ~0.2 MV/m |

The 3-phase composite will generally need the step of poling due to the piezoceramic incorporated therein. Accordingly, Table 2 presents the results of poling (i) pure polyimide, (ii) polyimide with just PZT ceramic inclusions, and (iii) a 3-phase composite material of polyimide having 0.1 percent SWNT and PZT ceramic inclusions. The remanent polarization values, which are indicative of the piezoelectric response, indicate that adding the PZT increases the $P_r$ slightly. The $P_r$ value increases dramatically, however, when poling a similar content of PZT-polyimide composite that further includes SWNTs. This result confirms that the presence of SWNTs raises the dielectric constant of the composite so that it is possible to pole the PZT particles and the polyimide simultaneously.

TABLE 2

| Remanent Polarization | | |
|---|---|---|
| Material | $E_p$ (MV/m) | $P_r$ (mC/m$^2$) |
| Polyimide | 50 | 7 |
| Polyimide + PZT | 50 | 11 |
| Polyimide + PZT + 0.1% SWNT | 50 | 84 |

The mechanical properties of the 2-phase and 3-phase composites were also measured to assess the effect of adding the SWNTs and PZT inclusions on the modulus of the polyimide. Test results reveal that significant reinforcement occurs at temperatures below and above the glass transition temperature due to the addition of SWNTs, although a larger reinforcement effect occurs at temperatures above the glass transition temperature.

Having various layers of electroactive composites exhibit variable electroactive properties can be valuable in a number of sensor applications where tunable optical and dielectric properties might be required for optimal performance, e.g., chemical sensors, optical waveguides, etc. By utilizing uniquely tailored electroactive materials to form a multilayer electroactive material, the embodiments can be used to provide functionally gradient electromechanical operation in a single device. Each layer is made from a new class of carbon nanotube polymer composite sensing/actuating materials. Sensing and actuating can be tailored layer-by-layer as a function of carbon nanotube loadings. The 2-phase and 3-phase carbon nanotube polymer composites described herein by way of illustration are good candidates for material layers of the exemplary embodiments as they provide greater sensing and actuating responses at much lower external stimuli as compared to other known electroactive materials.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function and step-plus-function clauses are intended to cover the structures or acts described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed as new and desired to be secured by Letters Patent of the United States is:

1. An electroactive material comprising multiple layers of electroactive material comprising at least one polymer component with each of said layers having unique dielectric, electrical and mechanical properties with respect to each of the other said layers that define a predetermined electromechanical operation of each of said layers when affected by an external stimulus, thereby providing the electroactive material with a functionally gradient response.

2. An electroactive material as in claim 1 wherein each of said layers is a carbon nanotube polymer composite.

3. An electroactive material as in claim 1 wherein each of said layers is a composite of (i) a polymer with polarizable moieties, and (ii) an amount of carbon nanotubes in said polymer effective to provide for a predetermined electromechanical operation of said composite when said composite is affected by an external stimulus.

4. An electroactive material as in claim 3 wherein, for each of said layers, said polymer is unique.

5. An electroactive material as in claim 3 wherein, for each of said layers, said polymer is the same.

6. An electroactive material as in claim 3 wherein, for each of said layers, said polymer is selected from the group consisting of polyimides, polyamides, silicon-based polymers, vinyl polymers, polyurethanes, polyureas, polythioureas, polyacrylates, polyesters and biopolymers.

7. An electroactive material as in claim 3 wherein, for each of said layers, said carbon nanotubes are selected from the group consisting of single-wall carbon nanotubes and multi-wall carbon nanotubes.

8. An electroactive material as in claim 3 wherein said multiple layers of electroactive material includes at least three layers each having said unique dielectric, electrical and mechanical properties.

9. An electroactive material as in claim 8, wherein at least one of said layers includes a polymer matrix and micro to nano-sized particles of an electroactive ceramic incorporated into the polymer matrix.

10. An electroactive material as in claim 8, wherein adjacent layers are only partially bonded to each other, thereby forming unbounded portions between said adjacent layers.

11. An electroactive material as in claim 10, wherein said adjacent layers define spaces with respect to each other to thereby form at least some of said unbounded portions.

* * * * *